United States Patent
Dennison et al.

(10) Patent No.: US 7,359,227 B2
(45) Date of Patent: Apr. 15, 2008

(54) SHARED ADDRESS LINES FOR CROSSPOINT MEMORY

(75) Inventors: Charles Dennison, San Jose, CA (US); Tyler Lowrey, West Augusta, VA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/202,428

(22) Filed: Aug. 11, 2005

(65) Prior Publication Data
US 2006/0120136 A1    Jun. 8, 2006

(30) Foreign Application Priority Data
Aug. 13, 2004   (EP)   .................. 04425631

(51) Int. Cl.
*G11C 5/02* (2006.01)
(52) U.S. Cl. .............. 365/51; 365/163; 365/171; 365/100; 365/158
(58) Field of Classification Search .............. 365/51, 365/163, 171, 100, 158
See application file for complete search history.

(56) References Cited

U.S. PATENT DOCUMENTS

| | | | |
|---|---|---|---|
| 5,515,311 A | 5/1996 | Mihara | 365/145 |
| 6,462,977 B2* | 10/2002 | Butz | 365/63 |
| 6,759,267 B2* | 7/2004 | Chen | 428/95 |
| 6,778,421 B2* | 8/2004 | Tran | 365/105 |
| 6,781,858 B2* | 8/2004 | Fricke et al. | 365/51 |
| 6,914,255 B2* | 7/2005 | Lowrey | 257/5 |
| 6,917,532 B2* | 7/2005 | Van Brocklin et al. | 365/51 |
| 6,965,521 B2* | 11/2005 | Li et al. | 365/148 |
| 6,975,555 B2* | 12/2005 | Lu et al. | 365/230.07 |
| 2003/0027378 A1 | 2/2003 | Kleveland et al. | 438/131 |
| 2003/0161180 A1 | 8/2003 | Bloomquist et al. | 365/173 |
| 2004/0090809 A1 | 5/2004 | Tran | 365/100 |
| 2005/0030788 A1* | 2/2005 | Parkinson et al. | 365/163 |

\* cited by examiner

*Primary Examiner*—Connie C. Yoha
(74) *Attorney, Agent, or Firm*—Lisa K. Jorgenson; Eric M. Ringer; Seed IP Law Group PLLC

(57) ABSTRACT

A crosspoint memory includes a shared address line. The shared address line may be coupled to cells above and below the address line in one embodiment. Voltage biasing may be utilized to select one cell, and to deselect another cell. In this way, each cell may be made up of a selection device and a crosspoint memory element in the same orientation. This may facilitate manufacturing and reduce costs in some embodiments.

30 Claims, 8 Drawing Sheets

US 7,359,227 B2

SHARED ADDRESS LINES FOR CROSSPOINT MEMORY

BACKGROUND OF THE INVENTION

1. Field of the Invention

This invention relates generally to crosspoint memories.

2. Description of the Related Art

Crosspoint memories are memories that use transverse addressing lines, such as row and column lines, with intervening programmable material. Examples of crosspoint memories include magnetic tunnel junction memory, resistive random access memory, ferroelectric random access memory, silicon oxide nitride oxide semiconductor memory, polymer memory, and phase change memory.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

Thus, there is a need for alternate ways to form crosspoint memories.

BRIEF SUMMARY OF THE INVENTION

According to one embodiment, a method includes biasing first and second address lines on opposite sides of a shared address line such that a first cell between the first address line and the shared address line is accessed and a second cell between the second address line and the shared address line is not accessed. In another embodiment, the method includes biasing a phase change memory cell. In a further embodiment, the method includes biasing a cell, including a selection device.

According to another embodiment, the method includes biasing the shared address line at a first voltage, biasing the first address line at a second voltage, and biasing the second address line at a voltage equal to one-half the first voltage. In another embodiment, the method includes biasing the shared address line at a first voltage, biasing the first address line at a second voltage, and biasing the second address line at a voltage equal to two-thirds the first voltage.

In yet another embodiment, the method includes biasing a selected cell to have a first voltage difference across the selected cell and biasing an unselected cell to have a second voltage difference, where the second voltage difference is less than the first voltage difference. In one embodiment, the first voltage difference across the selected cell is sufficient to turn its selection device on, and the second voltage difference across the unselected cell is insufficient to turn its selection device on.

In another embodiment, the method includes forming a crosspoint memory having cells, arranging a first cell and a second cell on opposite sides of a shared address line, and forming a selection device and a memory element in the first and second cells. The selection device and the memory elements of the first and second cells are arranged, with respect to one another, in the same orientation. In another embodiment, the memory element is a phase change memory element. In yet another embodiment, the selection device includes a chalcogenide material.

According to one embodiment of the invention, a crosspoint memory system includes a shared address line, a first cell and second cell on opposite sides of the shared address line, and a selection device and a memory element in the first and second cells. The selection device and memory element are arranged in the same orientation in the first and second cells.

According to another embodiment of the invention, a system includes a processor, a wireless interface, and a crosspoint memory coupled to the processor. The crosspoint memory includes a shared address line, a first cell and second cell on opposite sides of the shared address line, and a selection device and a memory element in the first and second cells, where the selection device and memory element are arranged in the same orientation in the first and second cells. In another embodiment, the shared address line is configured to selectively access either the first or the second cell.

DETAILED DESCRIPTION OF THE INVENTION

Figure 1:
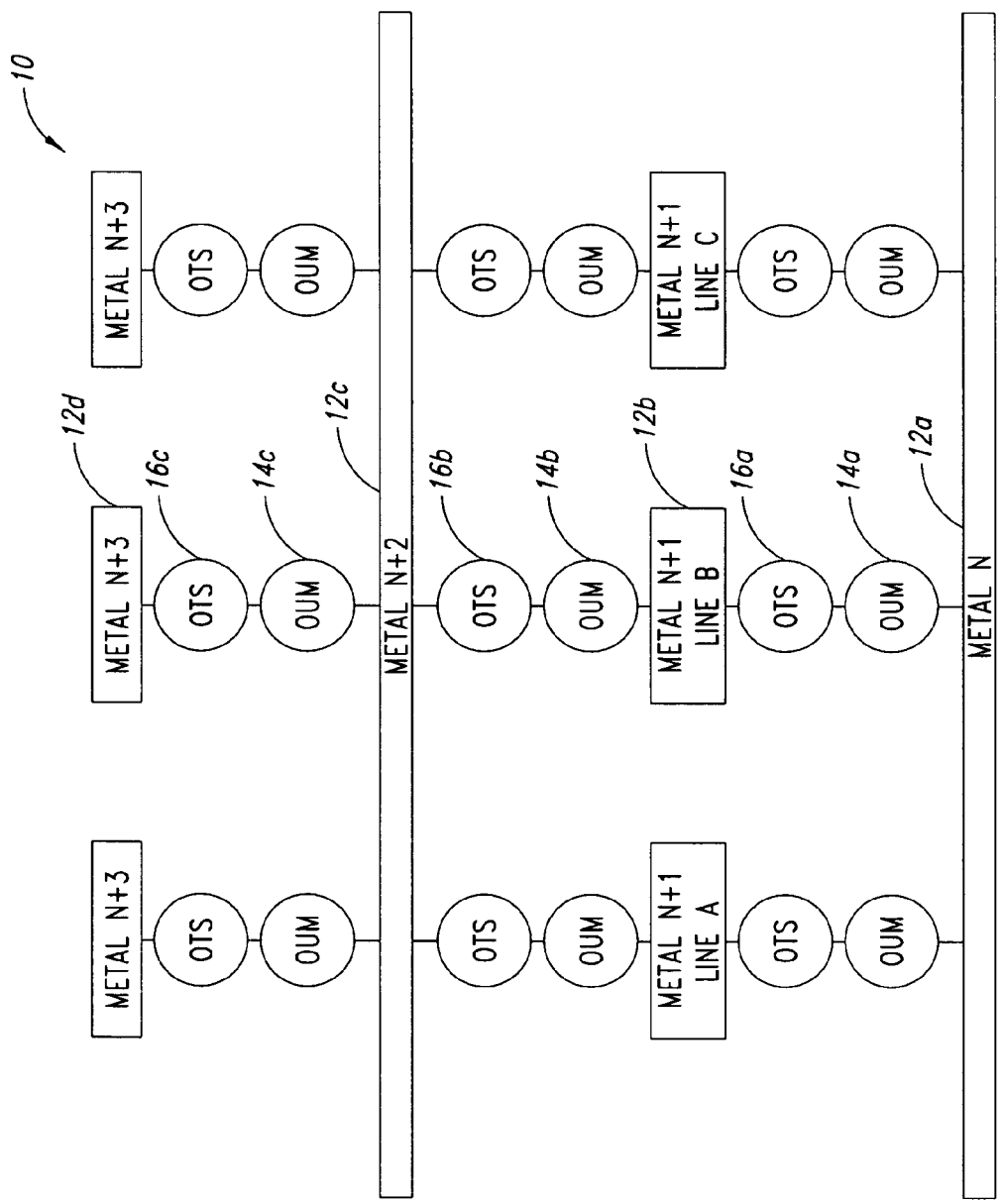
FIG. 1 is a schematic depiction of one embodiment of the present invention.

Referring to FIG. 1, a crosspoint memory 10, in accordance with one embodiment of the present invention, may be implemented as a phase change memory. The memory 10 may include address lines 12*a* and 12*c* extending in a first direction and generally transverse address lines 12*b* and 12*d*. Of course, a large number of additional lines may be provided.

In this embodiment, pairs of adjacent transverse lines (e.g., 12*a*-12*b*, 12*b*-12*c*, or 12*c*-12*d*) define at least one cell between them including a phase change memory element 14*a*, 14*b*, or 14*c* and a chalcogenide selection device 16*a*, 16*b*, or 16*c*. When an appropriate potential is applied between adjacent, transverse lines 12*a*-12*b*, for example, a selection device 16*a*, between the lines 12*a*-12*b*, turns on, allowing current flow across a memory element 14*a*.

While an embodiment of a crosspoint memory implemented as a phase change memory is illustrated, any other crosspoint memory may be used in other embodiments of the present invention.

Figure 2:
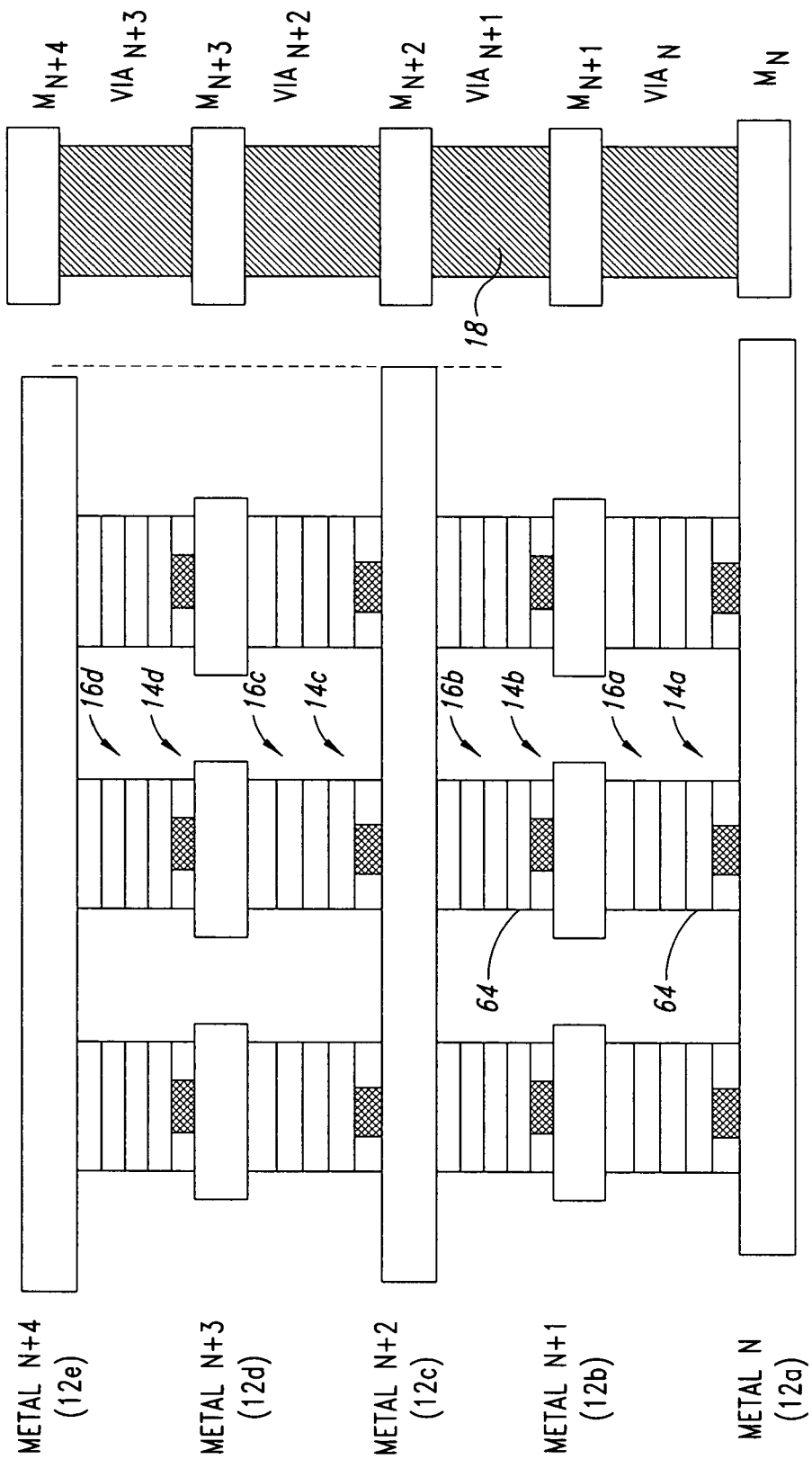
FIG. 2 is an enlarged, cross-sectional view of the embodiment shown in FIG. 1 in accordance with one embodiment of the present invention.

Referring to FIG. 2, the phase change memory elements 14*a*-14*d* may be implemented by a series of layers provided underneath the selection devices 16*a*-16*d* in one embodiment. Vias 18 may be provided between adjacent, but transverse lines 12a-12e, such as the lines 12a and 12b.

Thus, it may be understood from FIG. 2 that shared addressing lines 12a-12e are utilized. Namely, lines 12a-12e, such as the line 12d, is shared between an overlying cell (including the element 14d and the selection device 16d) and an underlying cell (including the selection device 16c and the memory element 14c). Similarly, the line 12c functions for selection of the overlying cell (including the selection device 16c and the memory element 14c), as well as for selection of the memory element 14b and selection device 16b underlying the line 12c. As a result, considerable economies may be achieved in some embodiments of the present invention, both in terms of cost and size.

In order to enable the shared addressing lines, a voltage biasing system is used. In particular, a read or write voltage V is applied. For example, a supply voltage V may be applied to the line 12c. In this case, the selected column includes a cell made up of the selection device 16b and the memory element 14b. The selection is achieved by providing a zero voltage on the appropriate line 12b, labeled line 'B' in FIG. 3, and a read or write voltage V on the line 12c in this embodiment. At the same time, unselected columns, such as the lines 12d or lines A and C, may be biased at half the read or write voltage V (i.e., one-half V). The line 12a may also be at half the read or write voltage V (i.e., one-half V).

The potential across the cells between unselected columns and unselected rows, such as the cell made up of the (left and right) selection device 16a and the memory element 14a, is zero. As a result, parasitic current may be significantly reduced. At the same time, the cell made up of the selection device 16b and memory element 14b has a half voltage bias across it in one embodiment. The cells between the selected column and unselected rows have half voltage across them. Also the cells between the selected row and unselected columns have half voltage across them. But the half voltage may be such that it is insufficient to turn on the selection device 16b. Thus, there is relatively little current flow between the selected row and unselected columns and the selected column and unselected rows. In one embodiment, by maintaining the voltage difference between adjacent lines at approximately half the read or write voltage and by appropriately selecting the threshold voltage of the selection devices 16a-16c, parasitic currents can be reduced in unselected columns and read or write disturbs in unselected cells may also be reduced.

Figure 3:
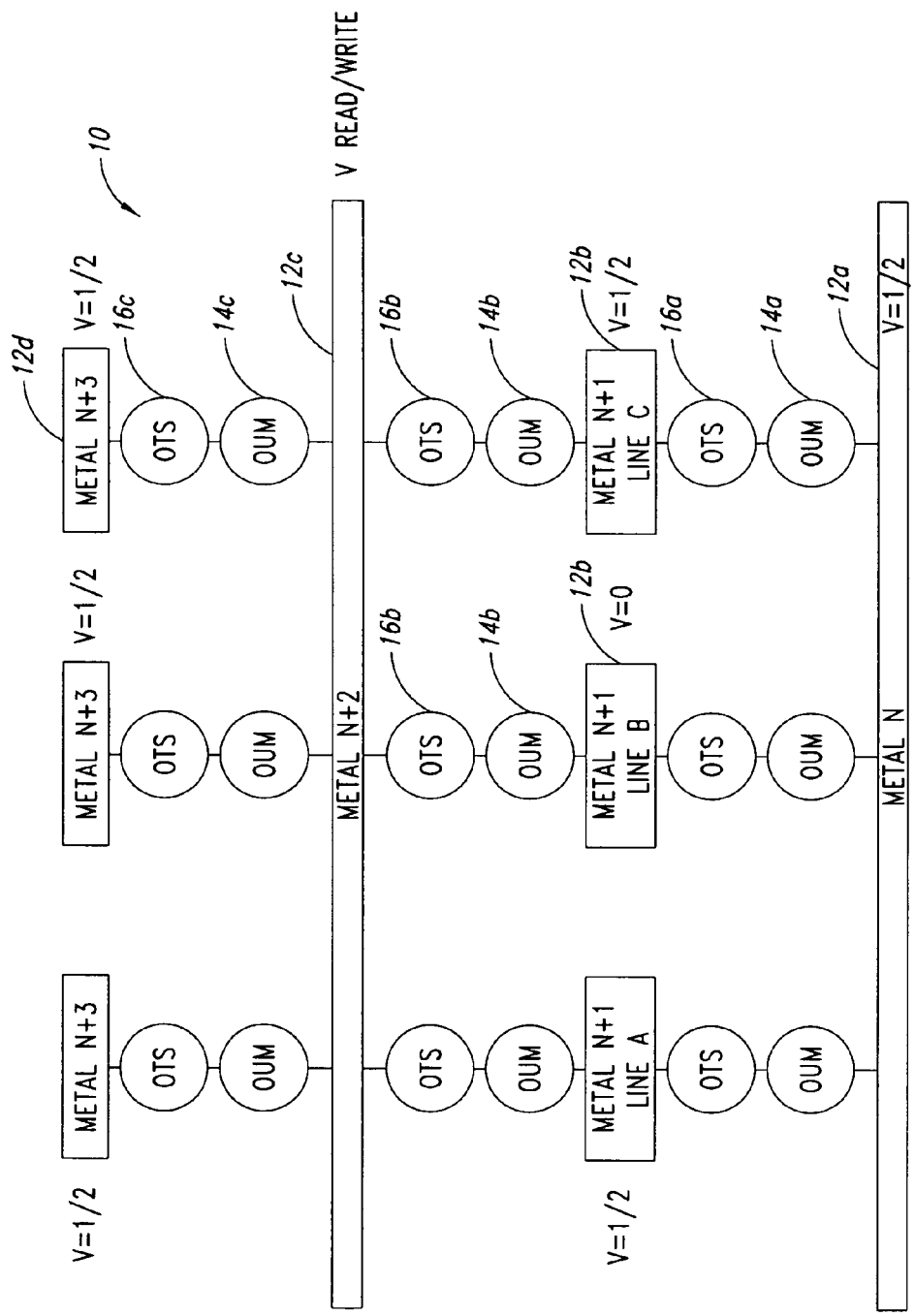
FIG. 3 is a schematic depiction corresponding to FIG. 1 in the course of reading or writing to the memory.

Thus, in the embodiment illustrated in FIG. 3, using a one-half voltage select array biasing scheme, the unselected row lines and unselected column lines are held at the half voltage potential. The selected row line is at zero volts or ground and the selected column line is ramped to the required voltage V for the intended read or write operation. If the maximum column voltage on the selected column line is ramped to the voltage V, which may be up to the supply voltage, then the maximum voltage across an unselected element, such as an element 14c in series with the selection device 16c, is half the voltage V. Sharing row and column metallizations may reduce the processing steps needed for each plane of memory in one embodiment.

In FIG. 3, the elements 14a-14c and devices 16a-16c are in the same polarity or orientation, such that the selection device 16a, for example, is fabricated after the memory element 14a so that the selection device 16a is on top. The read or write pulse comes in on top and the bottom line of the selected cell is held at ground. In this case, the current sources for reading and writing may be able to force current on columns or rows. In this embodiment, the current for reading and writing flows in the same direction from top to bottom for the select device and memory element. If the bottom conductive line is at ground and the top conductive line is at a positive voltage V, then current flows in a positive direction from top to bottom. If either the select device or memory device has asymmetrical iv characteristics then this method of operation would be desirable. Also it permits the same fabrication sequence (e.g. memory device on bottom (first) followed by the select device on top (last) to be utilized for all the elements).

The selection devices 16a-16c may be designed, in one embodiment, such that the level of voltage across the unselected cells only results in minimal parasitic leakage current and, thus, does not impact either the read or the write to the selected memory device while avoiding any-disturb of unselected bits. The voltage utilized for reading a selected memory bit may be less and, thus, there may be a wider design window for the selection devices 16a-16c to avoid significant conduction during the read operation. The voltage required to write the memory elements 14a-14c may be higher and, thus, there is more of a concern of leakage to the unselected bits during the write operation. To give more margin, it may be desirable to bias the memory for read and write operations at one-third the supply voltage or to bias at one-half for reading and one-third for writing in some embodiments.

In one embodiment, the material 64, in FIG. 2, may be a phase change material suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes in response to an application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material 64 may be chalcogenide element composition from the class of tellurium-germanium-antimony ($Te_xGe_ySb_z$) material or a GeSbTe alloy, although the scope of the present invention is not limited to just these materials.

In one embodiment, if the memory material 64 is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material 64 in the substantially amorphous state is greater than the resistance of the memory material in the substantially crystalline state. Accordingly, in this embodiment, the memory material 64 may be adapted to be altered to a particular one of a number of resistance values within a range of resistance values to provide digital or analog storage of information.

Programming of the memory material to alter the state or phase of the material may be accomplished by applying voltage potentials to the adjacent lines 12a-12b or 12b-12c, for example, thereby generating a voltage potential across the memory material 64. An electrical current may flow through a portion of the memory material 64 in response to the applied voltage potentials, and may result in heating of the memory material 64.

This controlled heating and subsequent controlled cooling may alter the memory state or phase of the memory material 64. Altering the phase or state of the memory material 64 may alter an electrical characteristic of the memory material

64. For example, resistance of the material 64 may be altered by altering the phase of the memory material 64. Either all or a portion of the phase change memory material may be altered during the writing pulse (i.e. only a portion/region of element 64 adjacent to either the top or bottom electrode may be phase changed during the write operation. In one embodiment primarily the portion of layer 64 that undergoes phase change is the region that is adjacent to the smaller lower electrode. The memory material 64 may also be referred to as a programmable resistive material or simply a programmable resistance material.

In one embodiment, a voltage pulse with a potential difference of about 0.5 to 1.5 V may be applied across a portion of the memory material by applying about 0 volts to a lower line 12*a* and about 0.5 to 1.5 V to an upper line 12*b*. A current flowing through the memory material 64 in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material 64 may be heated to a relatively higher temperature and then subsequently cooled at a fast rate to amorphisize memory material and "reset" memory material. Heating the volume or memory material to a relatively lower crystallization temperature may crystallize memory material and "set" memory material. Various resistances of memory material may be achieved to store information by varying the amount of current flow and duration through the volume of memory material, or by tailoring the edge rate of the trailing edge of the programming current or voltage pulse (that may impact the cooling rate of the select memory element).

The information stored in memory material 64 may be read by measuring the resistance of the memory material. As an example, a read current may be provided to the memory material using opposed lines 12*a*-12*b* and a resulting read voltage across the memory material may be compared against a reference voltage using, for example, the sense amplifier (not shown). The read voltage may be proportional to the resistance exhibited by the memory storage element.

In a low voltage or low field regime A, the device 16*a*, for example, is off and may exhibit very high resistance in some embodiments. The off resistance can, for example, range from 50,000 ohms to greater than 10 gigaohms at a bias of half the threshold voltage. The device 16*a* may remain in its off state until a threshold voltage $V_T$ or threshold current $I_T$ switches the device 16*a* to a highly conductive, low resistance on state. The voltage across the device 16*a* after turn on drops to a slightly lower voltage, called the holding voltage $V_H$ and remains very close to this holding voltage. In one embodiment of the present invention, as an example, the threshold voltage may be on the order of 1.1 volts and the holding voltage may be on the order of 0.9 volts.

After passing through the snapback region, in the on state, the device 16*a* voltage drop remains close to the holding voltage as the current passing through the device is increased up to a certain, relatively high, current level. Above that current level the device remains on but displays a finite differential resistance with the voltage drop increasing with increasing current. The device 16*a* may remain on until the current through the device 16*a* is dropped below a characteristic holding current value that is dependent on the area of the material and may be impacted by the top and bottom electrodes utilized to form the device 16*a*.

In some embodiments of the present invention, the selection device 16*a*, for example, does not change phase. It remains permanently amorphous and its current-voltage characteristics may remain the same throughout its operating life.

As an example, for a 0.5 micrometer diameter device 16*a* formed of TeAsGeSSe having respective atomic percents of 16/13/15/1/55, the holding current may be on the order of 0.1 to 100 micro-amps (uA) in one embodiment. Below this holding current, the device 16*a* turns off and returns to the high resistance regime at low voltage, low field. The threshold current for the device 16*a* may generally be of the same order as the holding current. The holding current may be altered by changing process variables, such as the top and bottom electrode material and the chalcogenide material. The device 16*a* may provide high "on current" for a given area of device compared to conventional access devices such as metal oxide semiconductor field effect transistors or bipolar junction transistors or semiconductor diodes.

In some embodiments, the higher current density of the device 16*a* in the on state allows for higher programming current available to the memory element 14*a*. Where the memory element 14*a* is a phase change memory, this enables the use of larger programming current phase change memory devices, potentially reducing the need for sublithographic feature structures and the commensurate process complexity, cost, process variation, and device parameter variation.

Figure 4:
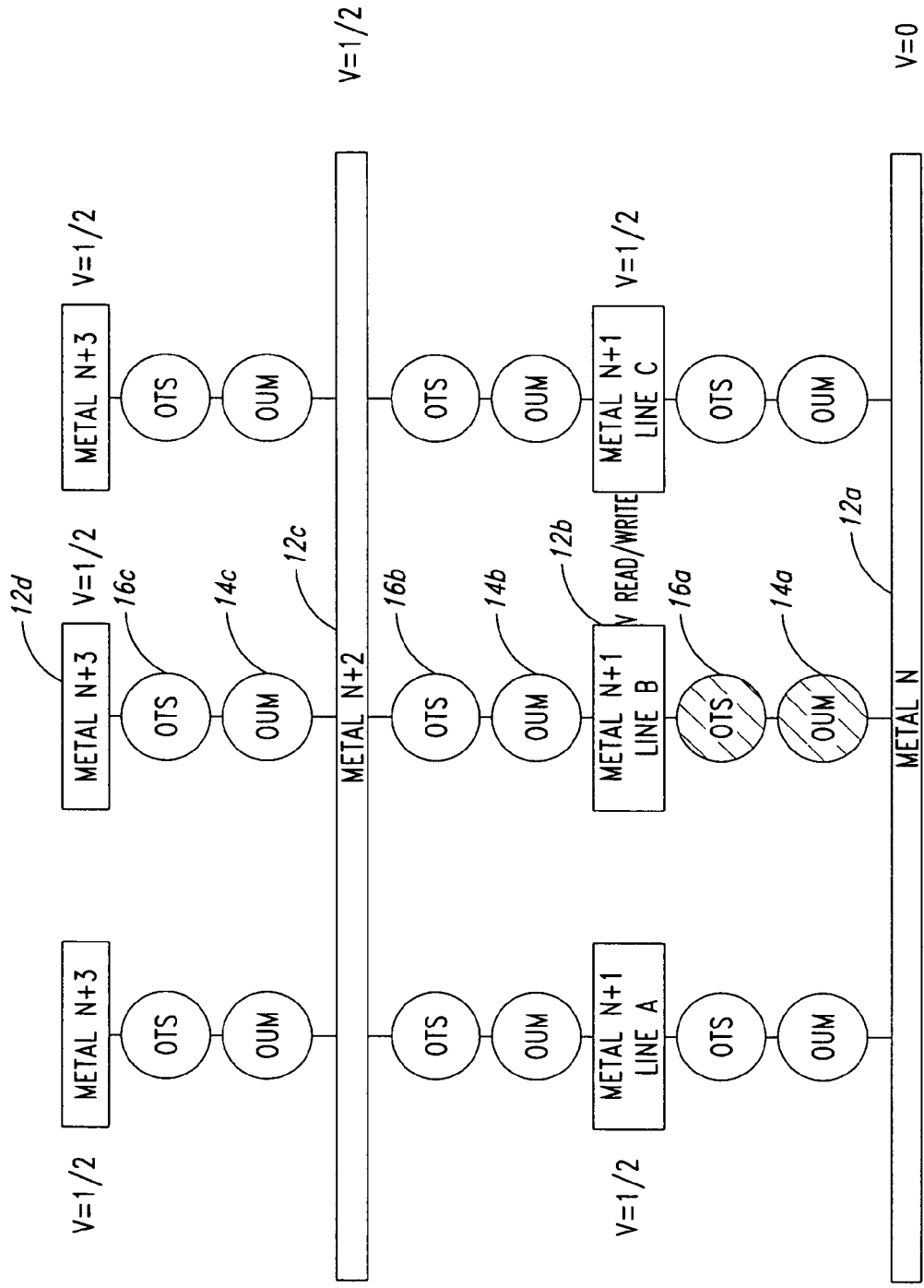
FIG. 4 is a schematic depiction corresponding to FIG. 3 in accordance with another embodiment of the present invention.

Referring to FIG. 4, the read/write current may be forced in either direction. In this case, the voltage for reading or writing is forced into the page along the line 12*b* (labeled "METAL N+1 LINE B,") which is transverse to direction current Was forced on the line 12*c* in the embodiment of FIG. 3.

Figure 5:
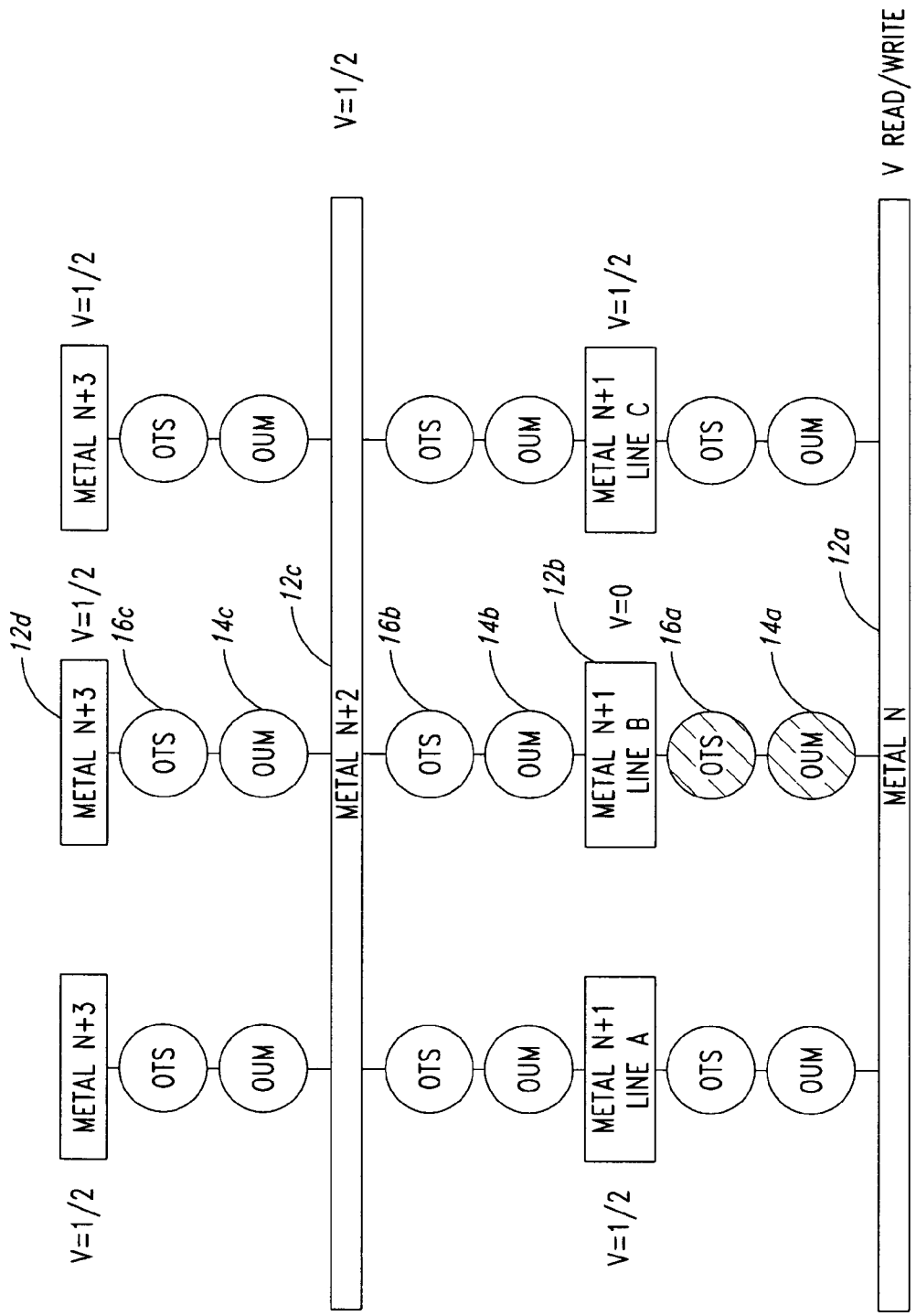
FIG. 5 is a schematic depiction corresponding to FIG. 3 of another embodiment of the present invention.

As shown in FIG. 5, reading or writing may be done from the "bottom up". Here, the addressing line 12*a* is supplied with the read or write voltage and the cell including the memory element 14*a* and the selection device 16*a* has a voltage difference sufficient to turn on the selection device 16*a*. Thus, while the read or write voltage is placed on the line 12*a*, zero volts may be placed on the line 12*b* (labeled "METAL N+1 LINE B"). Thus, reading or writing is possible from the top down (FIG. 4) or the bottom up (FIG. 5), depending on which plane of the memory is being accessed. One advantage of the embodiment of FIG. 5, compared to the embodiment of FIG. 4, is that it is not necessary in the embodiment of FIG. 5 to have current sources for reading or writing that are able to force current in the direction into the page.

Figure 6:
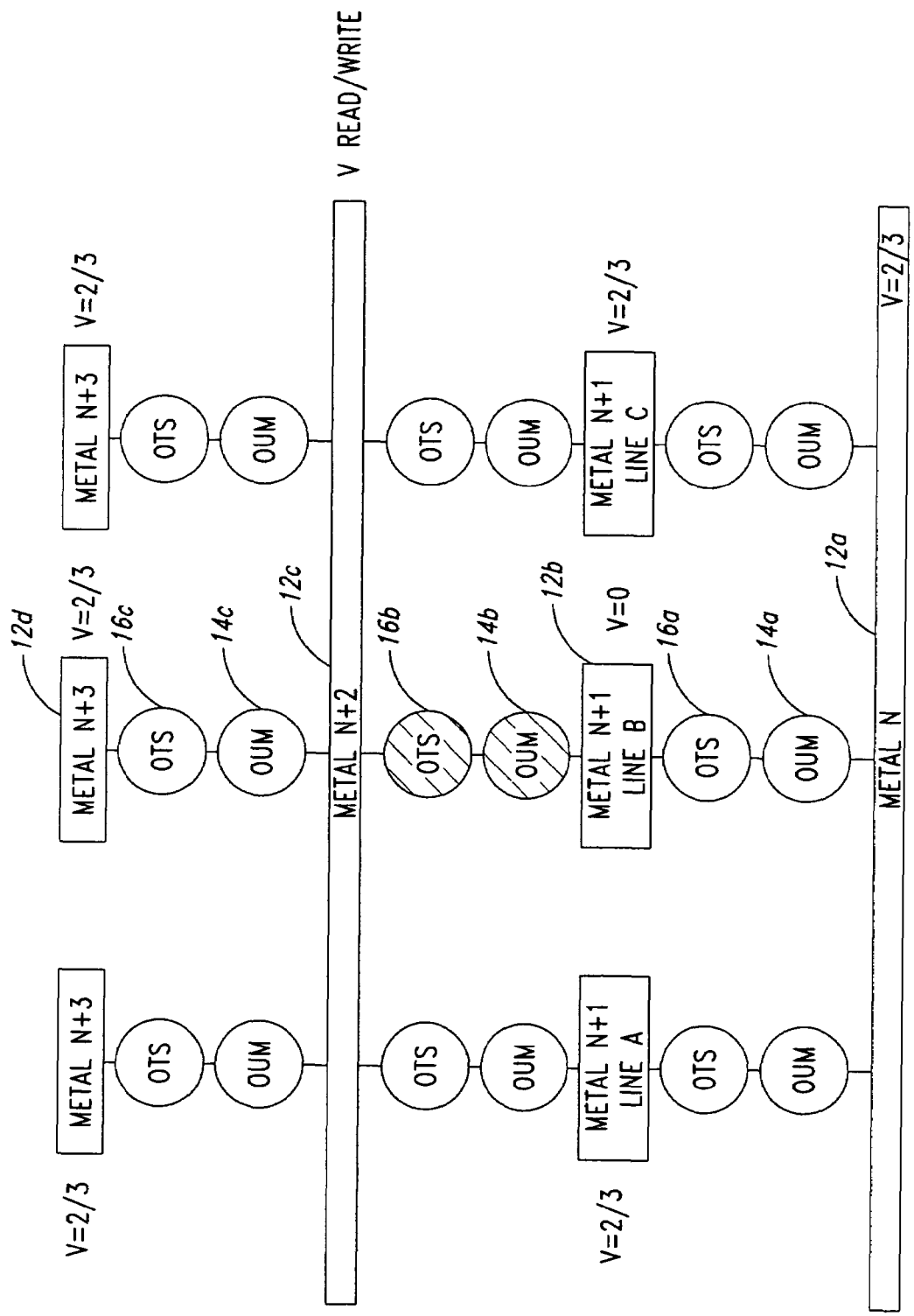
FIG. 6 is a schematic depiction of still another embodiment of the present invention.

FIG. 6 shows another embodiment of the present invention in which different bias voltages are utilized. In this case, the supply voltage divided by three may be utilized for biasing. The advantage of the one-third supply voltage biasing scheme in one embodiment for a single plane of memory may include increased voltage margin, since the maximum voltage across the unselected bits is now reduced to the supply voltage divided by three rather than the supply voltage divided by two. One disadvantage in some embodiments of the one-third supply voltage biasing scheme may be increased current between the unselected rows and unselected columns, since those rows and columns now have a voltage potential across them of one-third the supply voltage compared to no voltage across them per the half supply voltage bias scheme.

In FIG. 6, the read/write voltage is applied to the line 12*c* and zero volts are applied to the line 12*b* (labeled "METAL N+1 LINE B") in one embodiment. As a result, the selection device 16*b* turns on, and the memory element 14*b* can be read or written to. The unselected lines may have a voltage of two-thirds or one third of the read/write voltage applied to them. Thus, in the case of a cell positioned between the line 12c and an unselected transverse line (e.g., line A or line C parallel to line 12b), a voltage difference of one-third the supply voltage is applied across the cell (V−⅔V). Also the voltage between selected line 12b (labeled "METAL N+1 LINE B") and the bottom unselected METAL N lines is 0−⅓=−⅓V.

Figure 7:
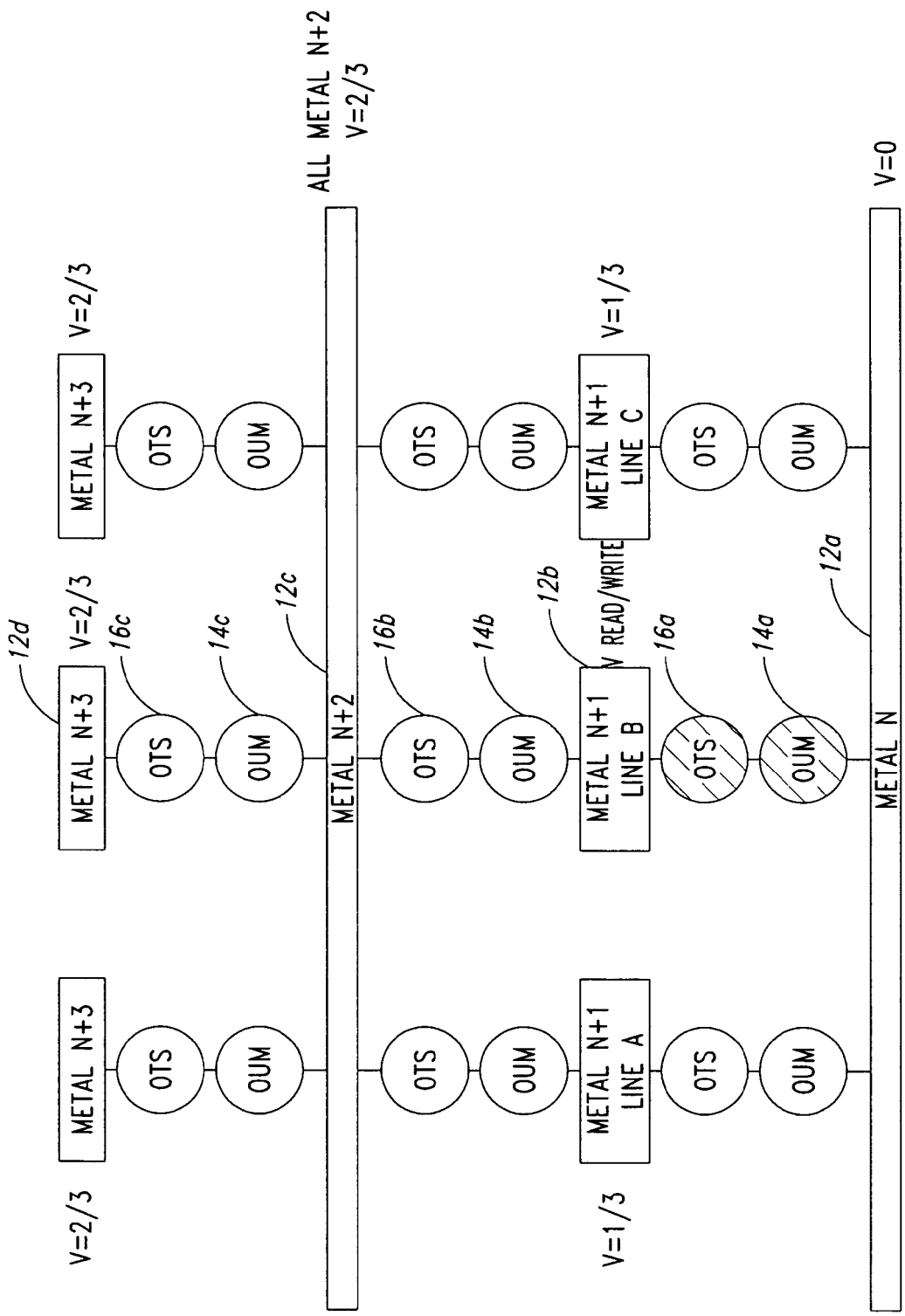
FIG. 7 is a schematic depiction of still another embodiment of the present invention.

FIG. 7 corresponds to FIG. 6 except now the unselected lines A and C receive one-third the voltage V, and the lower selected line 12a receives a voltage of zero in this embodiment. As a result, the unselected cells between the unselected Metal N+1 (i.e., lines A and C) and the Metal N have (R−1)*(C−1) cells in parallel with V/3 voltage across them. Also the unselected cells between the unselected Metal N+1 (i.e., lines A and C) and Metal N+2 have (R−1)*(C−1) cells in parallel with V/3 voltage across them leading to standby current (where R is the number of rows and C is the number of columns).

The table set forth below provides the voltages and currents for the reset, set and read states in accordance with one embodiment of a half supply voltage bias scheme. In the tables below, "BL" may correspond to a selected line 12a or 12b or 12c and "WL" may correspond to a selected line 12b or 12c or 12d (note: the BL is upper line and the WL is typically the lower line from FIGS. 1, 3).

|  | BL n−1 | BL n | BL n+1 | ALL above BL | WL n−1 | WL n | WL n+1 | ALL Below WL |
|---|---|---|---|---|---|---|---|---|
| RESET | Vcc/2 | 100 uA-1 mA | Vcc/2 | Vcc/2 | Vcc/2 | 0 V | Vcc/2 | Vcc/2 |
| SET | Vcc/2 | 50 uA-650 uA | Vcc/2 | Vcc/2 | Vcc/2 | 0 V | Vcc/2 | Vcc/2 |
| READ | Vcc/2 | 5 uA-100 uA | Vcc/2 | Vcc/2 | Vcc/2 | 0 V | Vcc/2 | Vcc/2 |

The table below shows a corresponding arrangement for one embodiment of the one-third supply voltage biasing scheme.

|  | BL n−1 | BL n | BL n+1 | ALL above BL | WL n−1 | WL n | WL n+1 | ALL Below WL |
|---|---|---|---|---|---|---|---|---|
| RESET | Vcc/3 | 100 uA-1 mA | Vcc/3 | ⅔ Vcc | ⅔ Vcc | 0 V | ⅔ Vcc | Vcc/3 |
| SET | Vcc/3 | 50 uA-650 uA | Vcc/3 | ⅔ Vcc | ⅔ Vcc | 0 V | ⅔ Vcc | Vcc/3 |
| READ | Vcc/3 | 5 uA-100 uA | Vcc/3 | ⅔ Vcc | ⅔ Vcc | 0 V | ⅔ Vcc | Vcc/3 |

Figure 8:
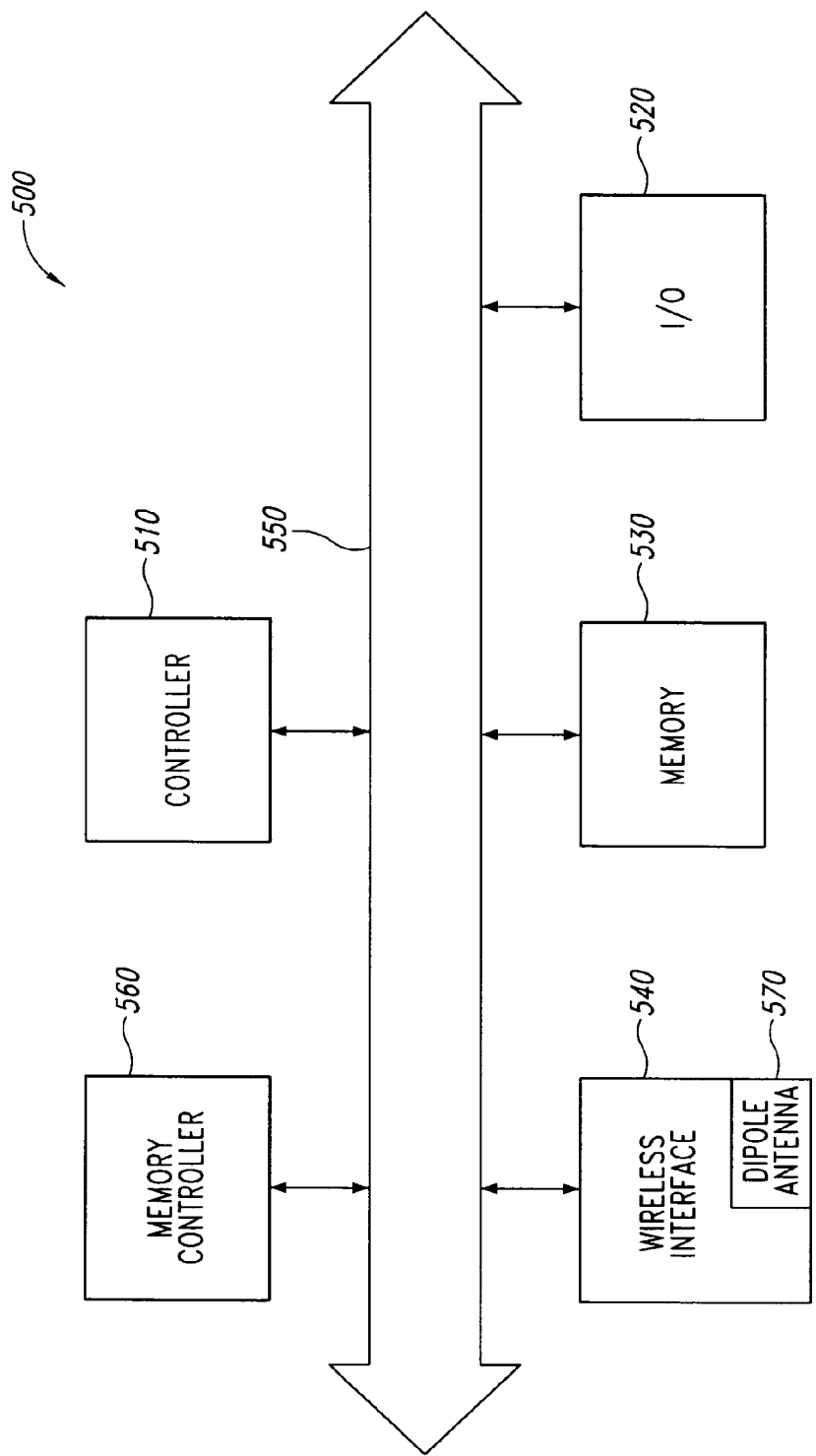
FIG. 8 is a system depiction of one embodiment of the present invention.

Turning to FIG. 8, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery (not shown) may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or crosspoint memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna 570, although the scope of the present invention is not limited in this respect. Also, the I/O device 520 may deliver a voltage reflecting what is stored as either a digital output (if digital information was stored), or it may be analog information (if analog information was stored).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method, comprising:
biasing a shared address line at a first voltage;
biasing a first address line at a second voltage; and
biasing a second address line at a third voltage, said first and second address lines being on opposite sides of the shared address line such that a first cell between the first address line and said shared address line is accessed and a second cell between the second address line and said shared address line is not accessed, wherein the magnitude of the third voltage is less than the magnitude of the first voltage.

2. The method of claim 1, including biasing a crosspoint memory.

3. The method of claim 1, including biasing a phase change memory cell.

4. The method of claim 1, including biasing a cell, including a selection device.

5. The method of claim 4, including biasing a cell, including a selection device having a chalcogenide material.

6. The method of claim 1 wherein the magnitude of the third voltage is approximately one-half of the magnitude of said first voltage.

7. The method of claim 1 wherein the magnitude of the third voltages is approximately two-thirds of the magnitude of said first voltage.

8. The method of claim 7, including biasing a third line, parallel to said first address line, at one-third of said first voltage.

9. The method of claim 6 wherein the second voltage is approximately zero volts.

10. A method, comprising:
biasing a first address line of a plurality of address lines in a crosspoint memory;
biasing a second address line of the plurality of address lines, said first and second address lines being on opposite sides of a shared address line of the plurality of address lines such that a first cell of a plurality of cells is accessed and a second cell of the plurality of cells is not accessed, the first cell being between the first address line and said shared address line, and the second cell being between the second address line and said shared address line;
biasing the first cell of the plurality of cells to have a first voltage difference across the first cell; and
biasing the second cell of the plurality of cells to have a second voltage difference, the second voltage difference being non-zero and lower than said first voltage difference.

11. The method of claim 10, including providing within each cell of the plurality of cells a respective selection device such that the first voltage difference across said first cell is sufficient to turn on the respective selection device of the first cell, and the second voltage difference across said second cell is insufficient to turn on the respective selection device of the second cell.

12. A crosspoint memory, comprising:
a shared address line;
a first address line;
a second address line, the first and second address lines being on opposite sides of the shared address line;
a first cell between the first address line and the shared address line;
a second cell between the second address line and the shared address line;
means for biasing the shared address line at a first voltage;
means for biasing the first address line at a second voltage; and
means for biasing the second address line at a third voltage such that the first cell is accessed and the second cell between the second address line and the shared address line is not accessed, wherein the magnitude of the third voltage is less than the magnitude of the first voltage.

13. The crosspoint memory of claim 12 wherein:
the first cell including a first selection device and a first memory element arranged in an orientation; and
the second cell on an opposite side of said shared address line from the first cell, the second cell including a second selection device and a second memory element arranged in the same orientation as the first selection device and the first memory element.

14. The memory of claim 13 wherein said first and second memory elements are phase change memory elements.

15. The memory of claim 13 wherein said first and second selection devices include a chalcogenide material.

16. The memory of claim 13 wherein said shared address line is configured to selectively access either the first or the second cell.

17. The memory of claim 12, including a first set of address lines extending in a first direction and a second set of address lines extending in a second direction transverse to the first direction.

18. The memory of claim 17 wherein the shared address line extends in the first direction, and wherein the first address line and the second address line extend in the second direction.

19. The memory of claim 13 wherein said first selection device is over said first memory element and said second selection device is over said second memory element.

20. The crosspoint memory of claim 13, wherein the selection device and the memory element of the first cell are arranged with the selection device being proximal to the shared address line and the memory element being distal from the shared address line, and wherein the selection device and the memory element of the second cell are arranged with the memory element being proximal to the shared address line and the selection device being distal from the shared address line.

21. A system, comprising:
a processor;
a wireless interface coupled to said processor; and
a crosspoint memory coupled to said processor, said crosspoint memory including
a shared address line,
a first address line,
a second address line, said first and second address lines being on opposite sides of the shared address line,
a first cell between the first address and the shared address line,
a second cell between the second address line and the shared address line,
means for biasing the shared address line at a first voltage,
means for biasing the first address line at a second voltage,
means for biasing the second address line at a third voltage such that the first cell is accessed and the second cell between the second address line and the shared address line is not accessed, wherein the magnitude of the third voltage is less than the magnitude of the first voltage.

22. The system of claim 21 wherein said shared address line is configured to selectively access either the first or the second cell.

23. The system of claim 21, including a first set of address lines extending in a first direction and a second set of address lines extending in a second direction transverse to the first direction.

24. The system of claim 23 wherein the shared address line is a member of the first set of address lines, and wherein the first address line and the second address line are members of the second set of address lines.

25. The system of claim 21 wherein said interface includes a dipole antenna.

26. The system of claim 21 wherein:
the first cell includes a first selection device and a first memory element, the first selection device being farther from the shared address line than the first memory element, and
the second cell includes a second selection device and a second memory element, the second memory element being farther from the shared address line than the second selection device.

27. The system of claim 26 wherein said first selection device is over said first memory element and said second selection device is over said second memory element.

28. The system of claim 27 wherein said first and second memory elements are phase change memory elements.

29. The system of claim 26 wherein said first and second selection devices include a chalcogenide material.

30. A method, comprising:
biasing a first address line of a plurality of address lines at a first voltage;
biasing a second address line of the plurality of address lines at a second voltage, the first address line and the second address line being on opposite sides of a first cell of a plurality of cells;
biasing all other address lines of the plurality of address lines at an intermediate voltage between the first voltage and the second voltage;
biasing the first cell of the plurality of cells to have a first voltage difference across the first cell; and
biasing all other cells of the plurality of cells to have a second non-zero voltage difference lower than said first voltage difference.

* * * * *

UNITED STATES PATENT AND TRADEMARK OFFICE
CERTIFICATE OF CORRECTION

PATENT NO. : 7,359,227 B2  Page 1 of 1
APPLICATION NO. : 11/202428
DATED : April 15, 2008
INVENTOR(S) : Charles Dennison et al.

It is certified that error appears in the above-identified patent and that said Letters Patent is hereby corrected as shown below:

Column 9
Line 26, "third voltages is approximately two-thirds of the magnitude" should read as
-- third voltage is approximately two-thirds of the magnitude --

Column 10
Line 13, "the second cell on an opposite side" should read as -- the second cell being on an opposite side --

Line 50, "crosspoint memory including" should read as
-- crosspoint memory including: --

Lines 56-57, "a first cell between the first address and the shared address line," should read as -- a first cell between the first address line and the shared address line, --

Line 63, "voltage," should read as -- voltage, and --

Column 11
Line 20, "element, and" should read as -- element; and --

Signed and Sealed this

Nineteenth Day of August, 2008

JON W. DUDAS
*Director of the United States Patent and Trademark Office*